(12) United States Patent
Tsujimura et al.

(10) Patent No.: US 7,362,560 B2
(45) Date of Patent: Apr. 22, 2008

(54) MULTILAYER ELECTRONIC COMPONENT AND METHOD FOR PRODUCING THE SAME

(75) Inventors: Yasuhiro Tsujimura, Aichi (JP); Akifumi Tosa, Aichi (JP); Motonobu Kurahashi, Aichi (JP); Manabu Sato, Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 422 days.

(21) Appl. No.: 11/144,741

(22) Filed: Jun. 6, 2005

(65) Prior Publication Data

US 2005/0269287 A1 Dec. 8, 2005

(30) Foreign Application Priority Data

Jun. 4, 2004 (JP) ............................. 2004-167800

(51) Int. Cl.
*H01G 4/228* (2006.01)
(52) U.S. Cl. .................................. 361/306.3; 361/306.2
(58) Field of Classification Search ............. 361/306.1, 361/306.3, 307, 309–310, 308.1, 308.2, 308.3
See application file for complete search history.

(56) References Cited

U.S. PATENT DOCUMENTS

| | | | | |
|---|---|---|---|---|
| 5,404,265 A | * | 4/1995 | Moresco et al. ......... | 361/306.1 |
| 6,532,143 B2 | * | 3/2003 | Figueroa et al. ......... | 361/301.4 |
| 6,795,295 B2 | * | 9/2004 | Murakami et al. ....... | 361/306.3 |
| 2003/0142460 A1 | * | 7/2003 | Naito et al. ............... | 361/306.1 |
| 2004/0184219 A1 | * | 9/2004 | Otsuka et al. ........... | 361/306.3 |
| 2004/0257749 A1 | * | 12/2004 | Otsuka et al. ........... | 361/306.3 |

FOREIGN PATENT DOCUMENTS

| | | |
|---|---|---|
| JP | 2001-230537 | 8/2001 |
| JP | 2003-158030 | 5/2003 |
| JP | 2003-318064 | 11/2003 |
| JP | 2004-153040 | 5/2004 |

\* cited by examiner

*Primary Examiner*—Eric Thomas
(74) *Attorney, Agent, or Firm*—Sughrue Mion, PLLC

(57) ABSTRACT

A multilayer electronic component including a multilayer ceramic capacitor is disclosed, which includes a laminate of dielectric layers and internal electrodes disposed on the dielectric layers; at least one via-conductor penetrating the dielectric layers and connecting to the internal electrodes; and at least one external terminal formed on an outer surface of the laminate and connecting to an end of the via-conductor, wherein the external terminal includes a lower bump formed on the outer surface of the laminate and an upper bump formed on the lower bump, and a diameter of the upper bump is smaller than that of the lower bump.

7 Claims, 4 Drawing Sheets

MULTILAYER ELECTRONIC COMPONENT AND METHOD FOR PRODUCING THE SAME

BACKGROUND OF THE INVENTION

1. Field of the Invention

The present invention relates to a multilayer electronic component, particularly to a multilayer capacitor comprising, a laminate comprising dielectric layers and internal electrodes; via-conductors penetrating the dielectric layers and connecting the internal electrodes; and external terminals formed on an outer surface of the laminate; and also relates to a method for producing the multilayer electronic component.

2. Description of the Related Art

Conventionally, a multilayer electronic component such as a multilayer ceramic capacitor and a multilayer wiring substrate contains a laminate in which a plurality of dielectric layers and a plurality of internal electrode layers are alternately laminated. Inside the laminate, the via-conductors penetrating the dielectric ceramic layers and connecting to the internal electrodes are formed so as to reduce inductance of the multilayer component. External terminals or rather external terminal pads for connecting to other electronic components are formed on the surfaces of the laminate as disclosed in U.S. Pat. No. 6,795,295 B2.

In Patent Document 1, each end of the via-conductors projects from the top and bottom surfaces of the laminated portion so as to serve as an external terminal electrode. In Patent Document 2, external terminal pads are attached to each end of the via conductors to serve as an external terminal electrode situated on the top surface of the laminated portion.

[Patent Document 1]: Japanese Patent Application Laid-Open (kokai) No. 2003-318064

[Patent Document 2]: Japanese Patent Application Laid-Open (kokai) No. 2003-158030

For example, conventional multilayer electronic components are produced by the following procedure. First, green ceramic sheets are prepared, and green internal electrode layers are formed on the surface thereof by printing an electrically conductive metallic paste. Next, these green sheets printed with the green internal electrode layers are laminated into a green ceramic laminate and then via-holes penetrating the green ceramic laminate are formed. Subsequently, the insides of the via-holes are filled with electrically conductive metallic paste to form via-conductors connecting to the internal electrodes. The electrically conductive metallic paste is also applied onto surfaces of the ceramic laminate to form external terminals connecting to the via-conductors. Then, the green ceramic laminate is fired so that the dielectric ceramic layers and the metallic electrodes are co-fired into a multilayer ceramic component. The external terminals are nickel-plated so as to assure soldering with other electronic components such as an IC chip and an IC chip substrate. Solder bumps comprising tin are normally formed on the external terminals for solder connection of other electronic components.

Reliable solderability and a durable solder bond are needed for solder-bonding an IC chip or IC chip carrying substrate to multilayer components such as a multilayer ceramic capacitor and a multilayer wiring substrate. In order to attain a reliable solderability, the nickel-plated external terminal has been further plated with gold. However, in recent years, lead-free solder comprising tin (Sn) having a high temperature melting point has become widely used but the area for forming external terminals on the multilayer is very limited. Thus, mere consideration of the material for the external electrode such as the use of gold-plated external terminals has not satisfactorily improved soldering process yield. Since the ends of the via-conductors penetrating the dielectric layers after drying and co-firing are likely recessed or rather not coplanar with the outer surface of the laminate due to the different shrinkage rates between dielectric layers and internal metallic electrodes, it is difficult to form uniform and coplanar external terminals for reliably connecting to other electronic components. Therefore, the shape of an external terminal on which a solder ball is molten in a solder reflow process is another factor which requires improvement with respect to solderability and durable solder bonding thereof.

SUMMARY OF THE INVENTION

It is, therefore, a first object of the present invention to provide a multilayer electronic component having external terminals formed thereon and capable of reliably solder bonding to other electronic components.

Another object of the present invention is to provide a method for producing an electronic multilayer component having external terminals formed thereon and capable of reliably solder bonding to other electronic components.

The above first object of the invention is achieved by providing a multilayer electronic component, comprising:
  a laminate of dielectric layers and internal electrodes;
  via-conductors penetrating the dielectric layers and connecting to the internal electrodes; and
  external terminals formed on an outer surface of the laminate and connecting to the via-conductors;
  wherein the external terminals each comprises a lower bump stepped from and formed on an outer surface of the laminate and an upper bump stepped from and formed on the lower bump, wherein a diameter of the upper bump is smaller than that of the lower bump.

An advantage of this multilayer electronic component is that since the diameter (D1) of the upper bump formed on the lower bump of the external terminal is smaller than the diameter (D2) of the lower bump as shown in FIG. 3, a solder ball to be placed and molten on the external terminal facilitates forming a uniform solder bump that is centralized around the upper terminal bump by surface tension of the molten solder. This structure maintains a sufficient height of the molten solder for reliably connecting the external terminal to other electronic component.

In order to more effectively attain the above advantage, the upper bump is preferably rounded, or a third bump is further formed on top of the upper bump.

Another advantage of the multilayer electronic component according to the invention is that since a step is formed between the upper and lower bumps formed in the external terminal, the total area for solder to contact the terminal is increased. Consequently, the invention provides an increase in solder bonding strength, compared to a conventional plain smooth terminal. Namely, the total area for the lower bumps arranged in a limited outer surface of the laminate can be advantageously reduced and thermal stress transferred therethrough can be relaxed, while a minimum solder bonding strength of the external terminals to other electronic component is maintained.

Still another advantage of this multilayer electronic component is that the upper bump of the external terminal can be electroless-plated by nickel and/or gold more uniformly than the lower bump. Consequently, solder starts to melt at the upper bump and then flows down smoothly to the lower bump in a terminal of this shape, thereby enhancing solderability of the entire surface area of the external terminal.

In a preferred embodiment of the invention, the multilayer electronic component provided with this external terminal has another feature in that the projected area of the upper bump as viewed from a direction normal to the outer surface of the laminate is smaller than that of the lower bump but is larger than that of the via conductor. This is because if the projected area of the upper bump viewed from such direction is larger than that of the via-conductor, only negligible additional inductance is created by the external terminal and solder formed thereon which would not adversely affect high frequency performance of the multilayer component (such as a multilayer ceramic capacitor for decoupling signals of a microprocessor IC chip).

In yet another preferred embodiment of the invention, the ratio of the diameter of the upper bump to that of the lower bump in the external terminal formed on the multilayer component is preferably about 0.3 to 0.9 and more preferably 0.5 to 0.8. If the diameter of the via-conductor penetrating in a multilayer capacitor is selected to be about 50-120 micrometers, the diameters for the lower bumps of the external terminals will be advantageously set to about 1.1 to 5 times larger than that of the via-conductors and will preferably be about 130-500 micrometers.

The height of the upper or lower bump is preferably about 5-50 micrometers, more preferably 15-35 micrometers, on the condition that a total height of the external terminal including the upper and lower bumps is preferably set to more than 25 micrometers up to 100 micrometers. Preferably, the external terminals including the upper and lower bumps formed on one ends of the via conductor penetrating the laminate and formed on a top surface of the laminate have a higher height than other external terminals comprising of a conventional bump (with no upper bump formed thereon) as formed on other ends of the via conductors and on a bottom surface of the laminate.

The external terminals are preferably made mainly of nickel, although other conductive metals such as copper, silver, palladium, or platinum and tungsten may be used. When nickel is incorporated in an inorganic metallization material for the external terminal, 15-45% by volume of the same dielectric ceramic material (as used in the dielectric ceramic layers of the multilayer ceramic component) is preferably blended with 55-85% by volume of the nickel. The nickel content of the external terminal is higher than that of the via-conductor and the dielectric ceramic content of the external electrode is higher than that of the via-conductor, according to yet another aspect of the invention.

The external terminals are preferably plated with nickel in a thickness of about 0.3-10 micrometers and/or further preferably plated with gold in a thickness of about 0.01-1 micrometers so as to assure solderability, e.g., of a lead-free tin alloy solder for electrically connecting an IC chip or an IC chip carrying substrate to the external terminals.

The above second object of the invention is achieved by providing a method for producing a multilayer electronic component, comprising:

alternately laminating green ceramic sheets and green internal electrode layers so as to form a green laminate;

forming via-holes penetrating through green ceramic sheets;

filling the via-holes with a conductive paste so as to form via-conductors therein for connecting to the internal electrodes;

printing a conductive paste onto ends of the via-conductors and onto a surface of the laminate so as to form lower external terminal bumps on the laminate;

printing a conductive paste onto the lower bumps so as to form upper bumps on the lower external terminal bumps such that a diameter of the upper bump is smaller than that of the lower bump; and co-firing the laminate, the via conductors and the external terminals so as to attain a multilayer electronic component;

wherein the conductive paste for forming the upper bumps has a higher viscosity than the conductive paste for forming the lower bumps.

An advantage of this method is that since the conductive paste for forming the upper bumps has a higher viscosity than the conductive paste for forming the lower bumps, the upper bumps that are stepped up from the lower bumps of the terminals can be easily formed.

This method for producing a multilayer electronic component may further comprise plating nickel and gold on the upper bumps, and is advantageous for producing a multilayer ceramic capacitor with terminal bumps having good solderability.

The multilayer electronic component according to the invention includes a multilayer ceramic capacitor and multilayer wiring substrate, etc., characterized as comprising a laminate of dielectric layers and internal electrodes (or rather internal conductive layers); via conductors penetrating the dielectric layer; and external terminals connected to the via conductors and arranged in a lattice form or in a grid-arrayed pattern on a surface of the laminate.

DESCRIPTION OF THE PREFERRED EMBODIMENTS

Preferred embodiments of the present invention will now be described by reference to the drawings. However, the present invention should not be construed as being limited thereto.

Figure 1:
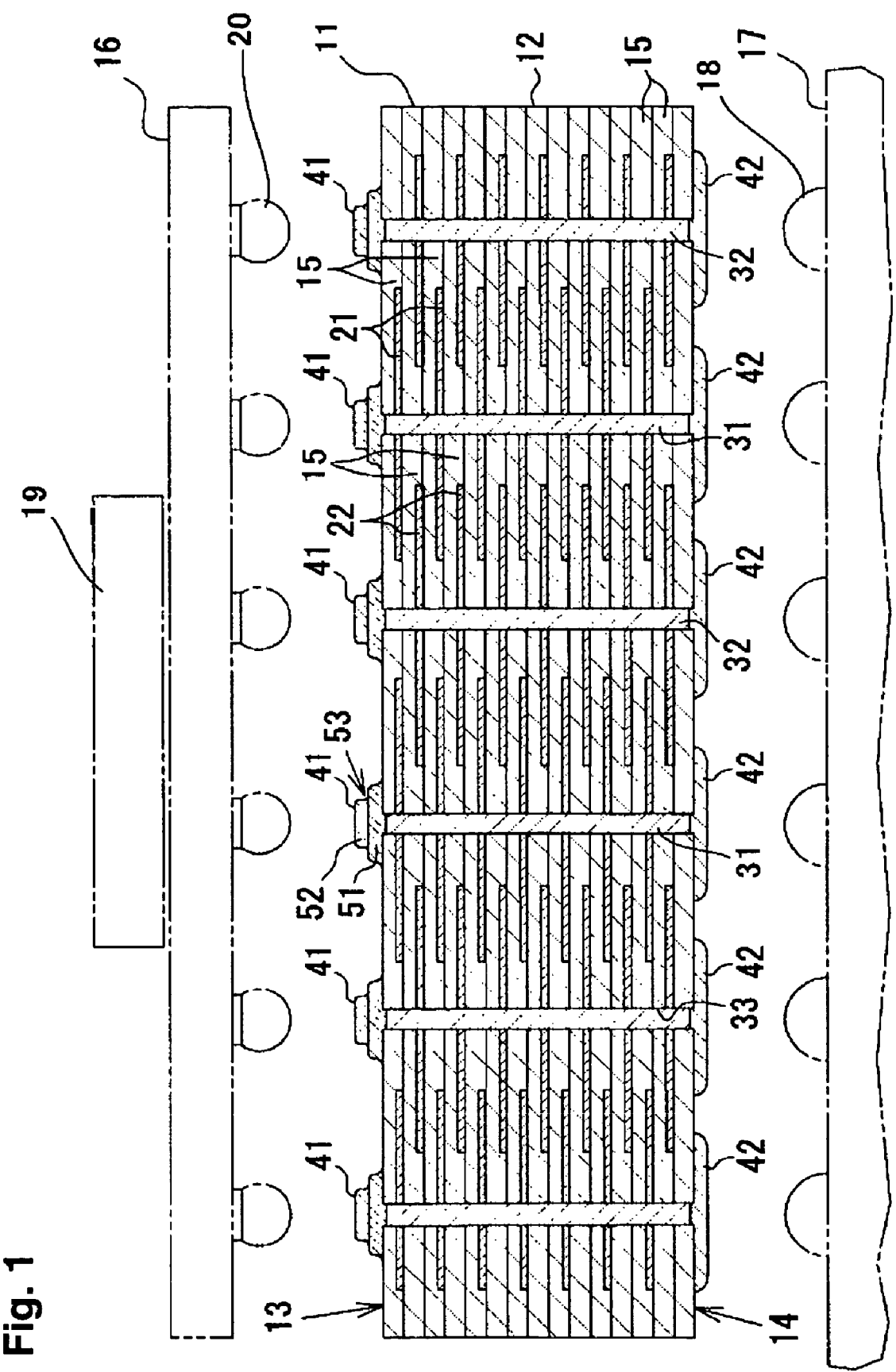
FIG. 1 shows a schematic sectional view of a multilayer ceramic capacitor (11) according to an aspect of the present invention.

Referring now to FIG. 1, a laminate 12 constituting a multilayer ceramic capacitor that is a preferred embodiment according to the invention, comprises a plurality of dielectric ceramic layers 15 and a plurality of internal electrode layers 21,22 alternately laminated.

This multilayer electronic component is a via-arrayed ceramic capacitor comprising a plate-like laminate having a top surface 13 (or rather a first main surface) and a bottom surface 14 (or rather a second main surface), wherein a plurality of columnar via-conductors 31,32 penetrating the laminate 12 are arrayed. The internal electrode layers are divided into two groups, one group comprising first internal electrodes 21 and the other group comprising second internal electrodes 22. The first internal electrodes 21 are connected by first columnar via-conductors 31 penetrating the dielectric layers 12 and the second internal electrodes 22 are connected by second columnar via-conductors 32 penetrating the dielectric layers 12.

Each dielectric layer 12 is sandwiched by first and second internal electrodes 21,22 such that a capacitance appears between the first and second internal electrodes 21,22. First external terminals 41 each comprising a lower bump 51 and an upper bump are formed and arrayed on a top outer surface of the laminate 12, the upper bumps 41 being smaller in diameter than the lower bumps 42. Second external terminals 42 each comprising a flat single bump are formed on and arrayed on a bottom surface 14 of the laminate 12. The first and second terminals 41,42 opposing each other between the laminate are connected by either the first or second columnar via-conductors formed in via-holes 33. The first columnar via-conductors 31 are electrically insulated from the second via-conductors 32 inside the laminate 12.

The first external terminals 41, for example, are to be soldered by solder balls 20 to a substrate 16 carrying an IC chip 19 so as to decouple signals from the IC chip 19. The second external terminals 42, for example, may mechanically and electrically contact solder bumps 18 formed on a motherboard or a multilayer wiring substrate 17.

The dielectric ceramic layers 15 may be made of dielectric materials such as barium titanate, titanate and strontium titanate. The internal electrodes, via-conductors and the external terminals each comprises a conductive material such as silver, gold, white gold, palladium, nickel, copper and tungsten. Among them, nickel added with dielectric ceramic material is preferable, since the nickel added with some dielectric ceramic material allows co-firing with the dielectric ceramic layers 15 so as to attain a co-fired laminate of the multilayer ceramic capacitor having high fracture toughness.

A preferred composition forming the external terminal 41 comprises about 55-85% by volume of conductive material such as nickel and about 15-45% by volume of dielectric ceramic material such as barium titanate, more preferably about 55-75% by volume of nickel and 35-45% by volume of dielectric ceramic material. The external terminals 41 with which the via-conductors are connected preferably have a higher dielectric ceramic content than the via-conductors 31,32. This is because good bonding strength and high thermal toughness are required for the external terminals 41 co-fired to the top surface 13 of the laminate 12 during or after soldering of the same to other electronic components.

The via-conductors 31,32 preferably have a higher dielectric ceramic content than the internal electrodes 21,22. This is because more impact or stress may be applied to the via-conductors 31,32 through the external terminals 41 as compared to the internal conductors 21,22.

In another preferred aspect of the invention, the upper bumps 52 have a higher conductive material content and lower dielectric ceramic material content than the lower bumps 51. This is because the electrical resistance of the external terminal 41 must be low and the dielectric ceramic content of the upper bumps 52 should therefore be reduced. Since the external terminal 41 comprises dielectric ceramic material and nickel, the external terminals 41 are plated with nickel so as to reduce the electrical resistivity thereof, and further plated with gold so as to improve solderability or wettability thereof to any solder.

The respective dielectric ceramic layers 15 each has a thickness of about 1 μm to 10 μm, preferably 3-6 μm and each internal electrode layer 21 or 22 has a thickness of 0.5 μm to 5 μm, preferably 1-3 μm. Each via-conductor has a diameter of about 50 μm to 120 μm, preferably 60 μm to 110 μm. A clearance or rather distance between the via-conductors is preferably about 100 μm to 600 μm, preferably 150 μm to 450 μm. An average pitch measured between the external electrodes coincides with that measured between the via-conductors.

The via-conductors 31,32 penetrate the laminate 12 comprised of the dielectric layers 15 and the internal electrodes 21,22 such that ends of the via-conductors 31,32 are connected to the first external terminals 41 formed on the top surface 13 of the laminate 12 or to the second external terminals 42 formed on the bottom surface 14 thereof. In order to reliably provide high co-fired strength of the external terminals 41 with the laminate 12, the ends of the via conductors preferably are about 2-5 micrometers from the surface of the laminate and co-fired with the lower bumps 52.

The external terminal 41 comprising the lower bump 51 and the upper bump 52, according to the invention, may be arranged on one surface only or on both top and bottom surfaces of the laminate 12 of the multilayer electronic component 11.

Figure 2:
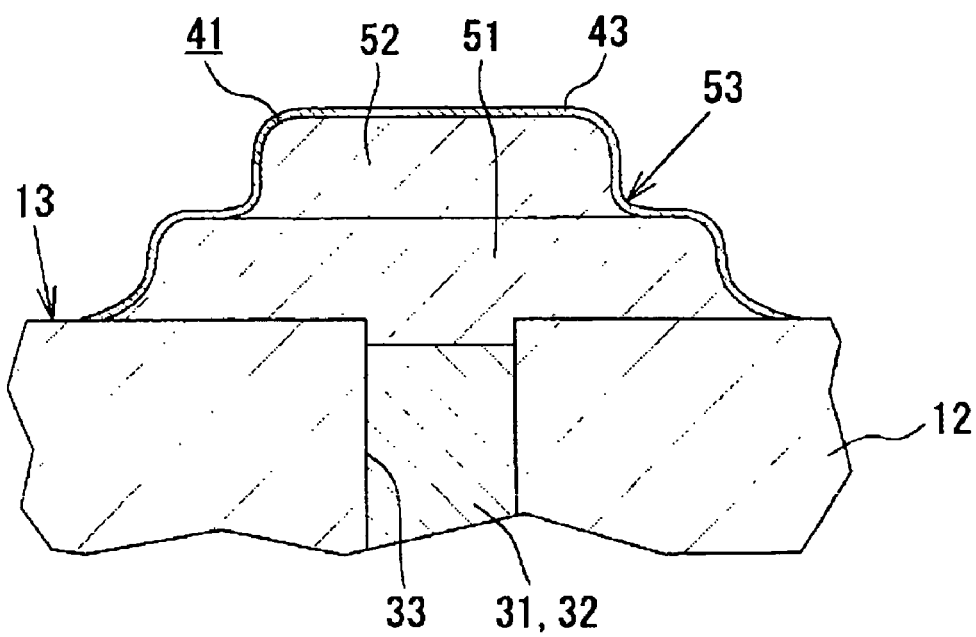
FIG. 2 is a schematic detailed sectional view of an external terminal (41) plated with a plating layer (43) and comprising an upper bump (52) and a lower bump (51) formed on the upper bump (52), formed on a top surface (13) of the multilayer ceramic capacitor (11) shown in FIG. 1.

FIG. 2 is an enlarged schematic sectional view of the first external terminal 41 incorporated in the multilayer ceramic capacitor according to an embodiment of the invention. The lower bump 51 is formed partly on an end of the via-conductor 31 or 32 and partly on the top surface 13 of the laminate 12. The upper bump 52 is formed on the lower bump 51 so that an angle and a step 53 is established between the upper and lower bump surfaces, thereby increasing the specific soldering area of the terminal 41, compared to a plain terminal without such an upper bump.

The main material of the upper bump 52 and lower bump 51 is preferably a conductive material comprising nickel and dielectric ceramic material. It is recommended that the external terminal 41 is nickel-plated, and then the nickel-plated terminal is further plated with gold so as to obtain reliable solderability of the nickel-plated terminal with a lead (Pb)-free solder alloy such 95.5 Sn-4Ag-0.5Cu. The nickel-plating layer 43 preferably has a thickness of 0.3-10 micrometers and the gold-plating layer plated further on the nickel-plating layer preferably has a thickness of 0.01 to 1 micrometers, as plated by electroless plating.

Figure 3:
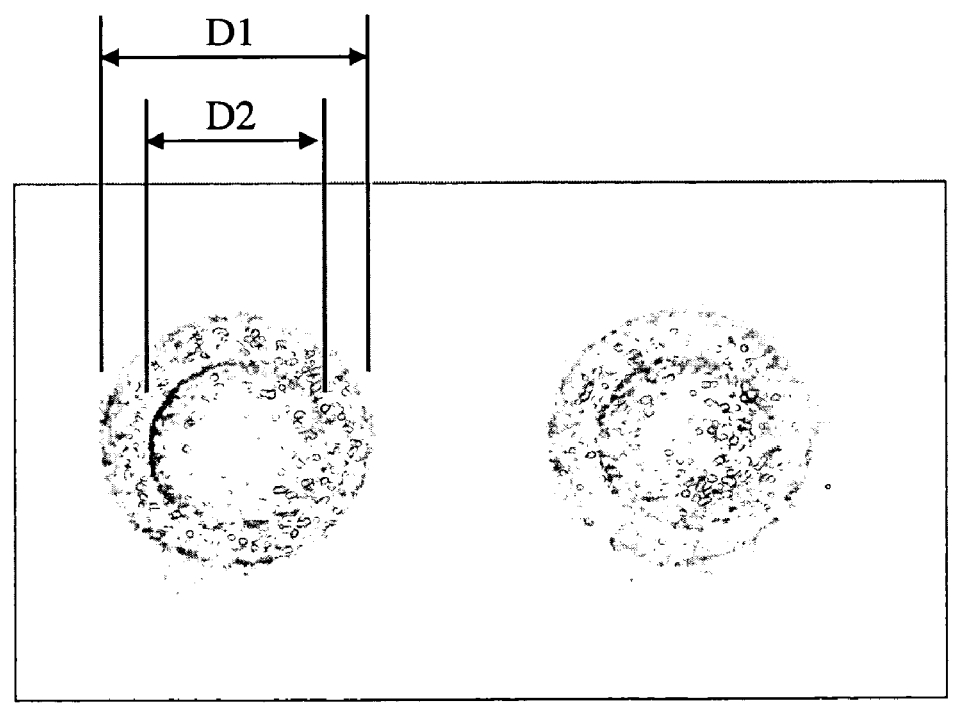
FIG. 3 is an enlarged photograph of two external terminals co-fired and formed onto a top surface of a multilayer electronic component according to the invention, each comprising a lower bump and an upper bump formed on the lower bump.

The projected area of the upper bump as viewed from the direction normal to the surface 13 of the laminate 12 is smaller than that of the lower electrode layer. That is, as shown in FIG. 3, the diameter (D2) of the upper bump is smaller than the diameter that of the lower bump as measured at the step portion 53 (of FIG. 2), and is preferably set to 0.3-0.9 times the diameter (D1) of the lower bump as measured at a position stepped up from the laminate top surface 13.

In addition, the projected area of the upper electrode layer surface 13 further preferably is larger than that of the via-conductor as viewed from the direction normal to the laminate surface 13. With this structure, possible disconnection due to a positional misalignment between the via conductor and the external terminal may be advantageously avoided. Also, stress caused by different thermal expansion between the metallic via-conductor 32 and the laminate 13 comprising dielectric ceramic layers may be advantageously absorbed at the external terminal 42. In addition, any impact possibly applied through the external terminal 41 and the solder 20 formed thereon to or from the laminate 13 may be advantageously alleviated, thereby reducing a risk of weakening the solder strength.

The external terminal 41 may have a multistage structure comprising more steps. That is, a double-step structure, a triple-step structure, or a quadruple-step structure may be adopted on the lower bump so that the soldering area of the external terminal is further increased for reliably soldering to electronic components having a finely pitched connection pattern, such as an IC chip or a mounting board for a semiconductor integrated circuit element.

The height of the external terminal 41 comprising at least one step portion between the lower bump and upper bumps, according to the invention, is set to preferably between about 25 μm to 100 μm. This is because heat from reflow gas having a melting temperature for a solder ball 20 to be placed on the external terminal 41 is effectively transferred so as to uniformly spread molten solder from the upper bump 52 to the lower bump 51.

Figure 4:
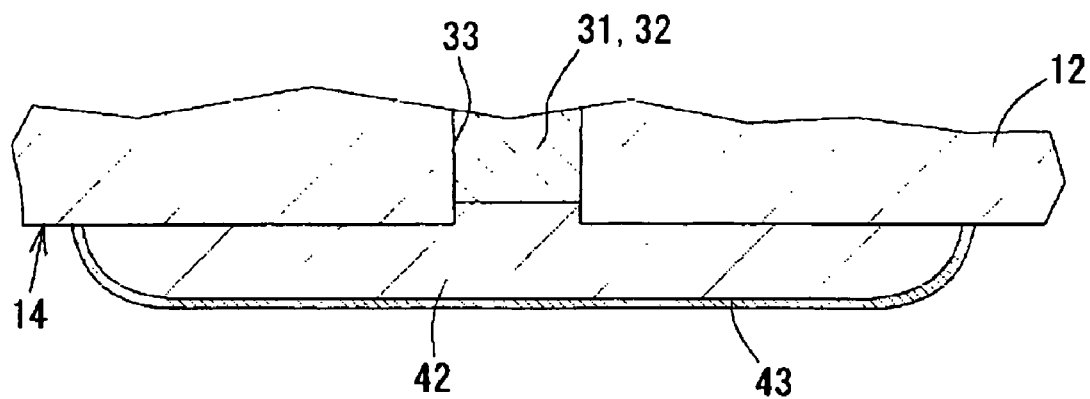
FIG. 4 is a schematic sectional view of a conventional external terminal (42) formed on a bottom surface (14) of the multilayer ceramic capacitor (11) shown in FIG. 1.

FIG. 4 is a schematic sectional view of a conventional external terminal 42 formed on a bottom surface 14 of the multilayer ceramic capacitor laminate 12 as shown in FIG. 1 and connecting to the via conductor 31 or 32 formed in the via hole 33. This plain external terminal 42 is also plated with a nickel-plating layer 43, and has almost half the height of the external terminals 41 formed on the top surface 13 of the multilayer ceramic capacitor 11 and a larger circular projected area as viewed from the direction normal to the laminate bottom surface 14, as compared to the external terminal 42 according to the invention. The diameter of this plain external terminal may be set to about 350-450 micrometers and may be further plated with gold if soldering is required.

Figure 5:
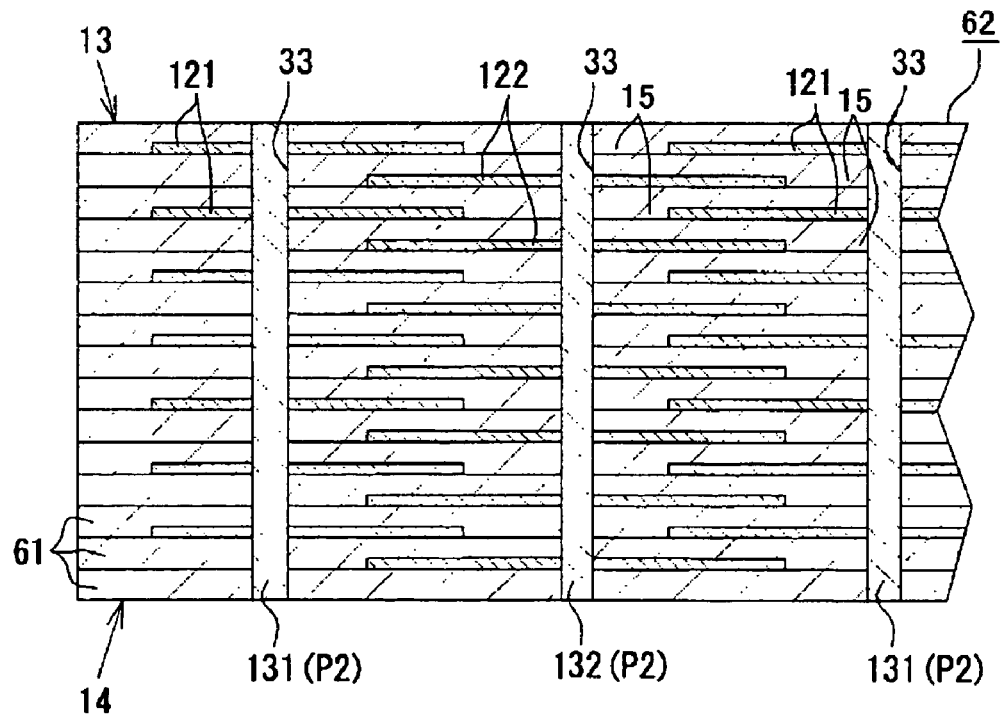
FIG. 5 is a sectional view of a green laminate (62) comprising green dielectric layers (61) and internal electrodes and a plurality of via conductors (131,132) formed by conductive paste (P2) filled in via-holes (33) penetrating the laminate, before forming external terminal electrodes onto ends of the via-conductors (131,132).
Figure 6:
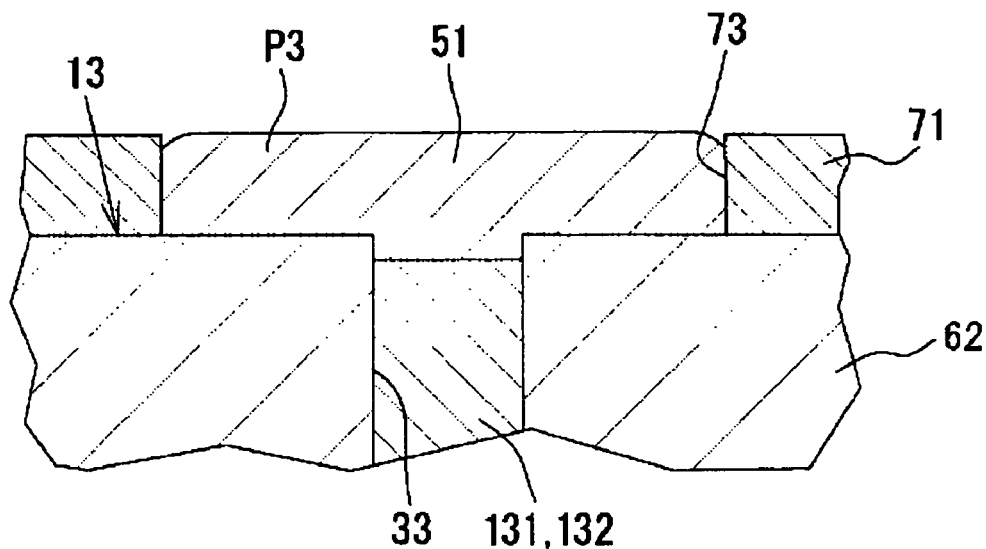
FIG. 6 shows a schematic sectional view, illustrating a lower bump (51) is formed on an end of the via conductor (131 or 132) and also on the top surface (13) of the green laminate (62) shown in FIG. 5, by painting a lower conductive paste (P3) through a screen mask (71).
Figure 7:
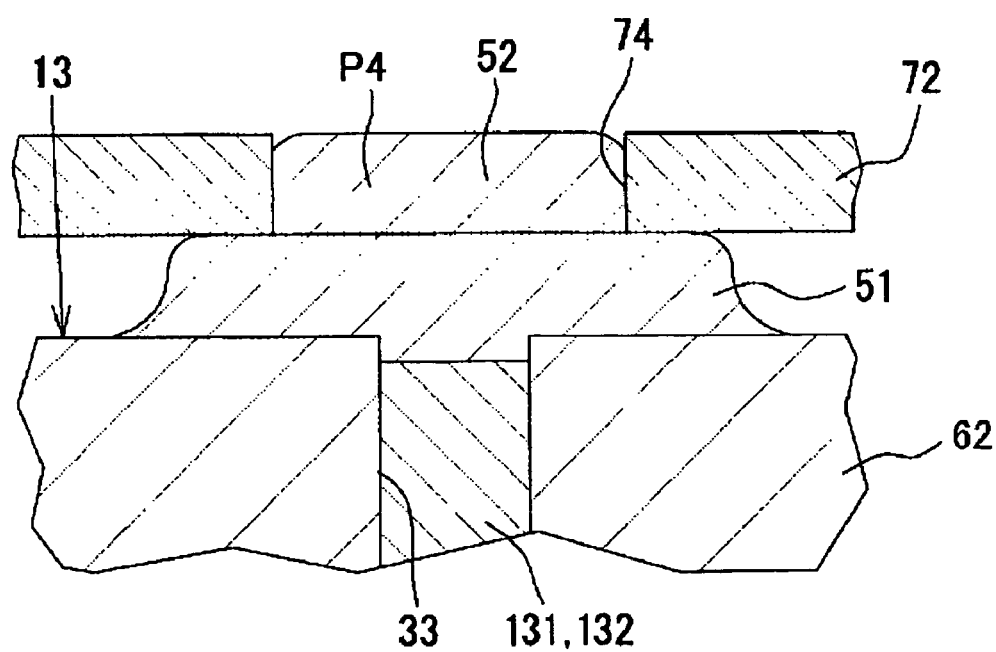
FIG. 7 shows a schematic sectional view, illustrating an upper bump (52) formed on the lower bump (51) shown in FIG. 6, by painting an upper conductive paste (P4) through a screen mask (72), the conductive paste (P3) having a higher viscosity than the conductive paste (P4) according to the method of the invention.

FIGS. 5 to 7 describe a method for producing a multilayer component.

Green dielectric ceramic layers 61 laminated for forming a green laminate 62 as seen in FIG. 5 are prepared by forming and cutting a film sheet containing, e.g., barium titanate powder, with either first or second green internal electrode layers 121,122 coated thereon. The green dielectric ceramic layer 61 has a thickness of about 5-8 μm and the green internal electrode layer coated thereon has a thickness of 2 μm to 3 μm. A nickel paste (P1) comprising about 55% by mass (by weight) of inorganic solid and about 45% by mass of a vehicle is used for coating for the internal electrode layers 121, 122. The inorganic solid comprises about 75-85% by volume of a nickel powder ($D_{SEM}$=0.41 μm) and the same dielectric ceramic powder that is used for making the green dielectric ceramic layer 61 (e.g., barium titanate powder), while the vehicle comprises a resin (e.g., ethyl cellulose) and an organic solvent (e.g., terpineol). The viscosity of the first nickel paste is adjusted to about 20 Pa·s for this printing.

A green laminate 62 having a thickness of about 1 μm is formed by alternately laminating a number of the first and second green dielectric layers 15 coated with the first or and second green internal electrodes 121, 122.

A plurality of via holes 33 having a diameter size of about 120 μm and penetrating the green laminate 62 are made by means of laser beam irradiation.

A second nickel paste (P2) comprising about 90% by mass of the inorganic solid and about 10% by mass of the vehicle is filled into the via-holes 33 so as to form the green via conductors 131, 132. The inorganic solid comprises about 65-75% by volume of a nickel powder ($D_{SEM}$=0.4 μm to 3 μm) and about 25-35% by volume of the same ceramic powder material as used to form the green ceramic layers 61 (e.g., barium titanate powder), while the vehicle comprises a resin (e.g., ethyl cellulose), an organic solvent (e.g., terpineol) and additives such as a dispersant and an antioxidant.

In view of the filling and firing properties of the second nickel paste (P2) to be filled into the via holes, the viscosity thereof is adjusted to about 100,000 Pa·s to 1,000,000 Pa·s, preferably, to 200,000 Pa·s to 300,000 Pa·s. Notably a composition and a grain size of inorganic solid in the second nickel paste (P2) for the green via-conductors 131,132 should be optimized to match its firing shrinkage with that of the green dielectric ceramic layers 61 so that the green laminate 62 can be co-fired without generating cracks or deforming. Therefore, a very high viscosity second nickel paste P2 for forming the via-conductors is used. The pressure needed for filling the second nickel paste into the via-holes 33 is preferably in a range of about 2.0 MPa to 7.5 MPa, according to the invention.

On the other hand, because the first nickel paste (P1) for forming the green internal electrodes 121,122 must be applied uniformly and thinly, the composition and the grain size of the inorganic solid of the first nickel paste (P1) is optimized so as to provide a viscosity of 10 Pa·s to 30 Pa·s, which is an extremely low viscosity as compared to the second nickel paste (P2). The first nickel paste (P1) for forming the internal electrodes layers 121,122 is printed by employing a mesh mask which is more suitable for printing a low viscosity paste than a metal mask.

The viscosity of the various nickel pastes (P1-P4) employed for producing multilayer ceramic capacitor according to the invention is adjusted by altering the nickel content and the amount of organic solvent included therein. A reliable multilayer ceramic capacitor is attained when the nickel content of the fired internal electrodes 21,22 is lower than the nickel content of the fired via-conductors 31,32, and the nickel content of the fired external electrode 41 formed on the top surface of the fired laminate 12 is higher than the nickel content of the fired via-conductors 31,32.

FIGS. 6 and 7 illustrate a method for forming the external terminal electrode 41 comprising the lower bump 51 and the upper bump 52 formed on the top surface 13 of the laminate 62. A third nickel paste (P3) for forming the lower bump 51 of the external terminal comprises about 70% by mass of inorganic solid and 30% by mass of vehicle. The inorganic solid contains about 55-65% by volume of a nickel powder ($D_{SEM}$=0.4 μm to 3.0 μm) and about 35-55% by volume of the same ceramic material as used for forming dielectric ceramic layer (e.g., barium titanate powder), while the vehicle comprises a resin (e.g., ethyl cellulose) and an organic solvent (e.g., terpineol). The viscosity of the third nickel paste (P3) is adjusted to be about 100 Pa·s at the time of printing. This third nickel paste (P3) may be also used for forming a conventional external terminal 42 to be formed on a bottom surface 14 as shown in FIG. 4.

A fourth nickel paste (P4) comprising about 80.0% by mass of inorganic solid and about 20.0% by mass of a vehicle is used for forming upper bump 52 on the lower bump 51. The inorganic solid comprises about 55-85% by volume of a nickel powder ($D_{SEM}$=0.4 μm to 3.0 μm) and 15-45% by volume of the same material used for forming the dielectric ceramic layer 15 (e.g., barium titanate powders). By adjusting the content of the vehicle comprising a resin (e.g., ethyl cellulose) and an organic solvent (e.g., terpineol), the viscosity of this fourth nickel paste (P4) is preferably set to about 1000 Pa·s at the time of printing, which viscosity is higher than the nickel paste (P3) for forming the lower bumps 51.

Subsequently, a plurality of via holes 33 having a diameter size of about 120 μm are formed by means of laser irradiation, to thereby penetrate the green laminate 62. Then, green via-conductors 131 and 132 are filled in that later form via-conductors 31 and 32 after co-firing.

Next, the green sheet laminate 62 is subjected to degreasing after grooves for a subsequent breaking operation (dicing) are formed in the green laminate, and is then co-fired with the external terminals and via conductors for a period of 2 hours at a temperature of 1200-1300° C. so as to form a multilayer ceramic body.

Next, each of the fired external terminals 41,42 of the multilayer ceramic body is subjected to electroless nickel plating to form a nickel plating layer having a thickness of about 0.5 μm to 3.0 μm thereon, followed by electroless gold plating to form a gold plating layer having a thickness of about 0.1 μm to 1.0 μm thereon. The fired multilayer ceramic body is diced along the grooves so as to obtain a plurality of multilayer ceramic capacitors 11 as shown in FIG. 1.

It should further be apparent to those skilled in the art that various changes in form and detail of the invention as shown and described above may be made. It is intended that such changes be included in the spirit and scope of the claims appended hereto.

This application is based on Japanese Patent Application No. 2004-167800 filed Jun. 4, 2004, incorporated herein by reference in its entirety.

What is claimed is:

1. A multilayer electronic component comprising:

a laminate of dielectric layers and internal electrodes disposed on the dielectric layers;

at least one via-conductor penetrating the dielectric layers and connecting to the internal electrodes; and at least one external terminal formed on an outer surface of the laminate and connecting to an end of a via-conductor, wherein the external terminal comprises a lower bump formed on the outer surface of the laminate and an upper bump formed on the lower bump, and a diameter of the upper bump is smaller than that of the lower bump.

2. The multilayer electronic component as claimed in claim 1, wherein a projected area of the upper bump is smaller than that of the lower bump and is larger than that of the via conductor, all as viewed from a direction normal to the outer surface of the laminate.

3. The multilayer electronic component as claimed in claim 1, wherein the external terminal is made mainly of nickel and is co-fired with the laminate.

4. The multilayer electronic component as claimed in claim 1, wherein the upper bump has a rounded shape.

5. The multilayer electronic component as claimed in claim 1, wherein at least the upper bump of the external terminal is plated with nickel and gold.

6. The multilayer electronic component as claimed in claim 1, wherein the multilayer electronic component is a multilayer ceramic capacitor.

7. The multilayer electronic component as claimed in claim 1, further comprising an IC chip or an IC chip carrying substrate soldered to one or more upper bumps of the external terminal.

* * * * *